United States Patent
Dighde et al.

(10) Patent No.: US 9,812,667 B2
(45) Date of Patent: Nov. 7, 2017

(54) PATTERNING OF OLED DISPLAY STACKS

(71) Applicant: Microsoft Technology Licensing, LLC, Redmond, WA (US)

(72) Inventors: Rajesh Dighde, Redmond, WA (US); Ying Zheng, Redmond, WA (US); Sergey Lamansky, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 14/932,051

(22) Filed: Nov. 4, 2015

(65) Prior Publication Data

US 2017/0125728 A1   May 4, 2017

(51) Int. Cl.
| | |
|---|---|
| *H01L 51/52* | (2006.01) |
| *H01L 27/32* | (2006.01) |
| *H01L 51/00* | (2006.01) |

(52) U.S. Cl.
CPC ...... *H01L 51/5253* (2013.01); *H01L 27/3258* (2013.01); *H01L 51/0097* (2013.01); *H01L 51/5262* (2013.01); *H01L 51/5281* (2013.01); *H01L 27/3244* (2013.01); *H01L 2251/5338* (2013.01)

(58) Field of Classification Search
CPC .............. H01L 51/5253; H01L 27/3258; H01L 51/0097; H01L 51/5262
USPC ........................................................ 257/88
See application file for complete search history.

(56) References Cited

U.S. PATENT DOCUMENTS

| | | |
|---|---|---|
| 7,063,902 B2 | 6/2006 | Kikuchi et al. |
| 7,221,332 B2 | 5/2007 | Miller et al. |
| 7,255,823 B1 | 8/2007 | Guenther et al. |
| 7,259,505 B2 | 8/2007 | Cok |

(Continued)

FOREIGN PATENT DOCUMENTS

| | | |
|---|---|---|
| CN | 103150965 | 6/2013 |
| WO | 2014085199 A1 | 6/2014 |
| WO | 2015149458 | 10/2015 |

OTHER PUBLICATIONS

Andrea Pais et al., "High-Sensitivity, Disposable Lab-on-a-Chip with Thin-Film Organic Electronics for Fluorescence Detection", Lab Chip, 2008, pp. 794-800.

(Continued)

*Primary Examiner* — Yasser A Abdelaziez
(74) *Attorney, Agent, or Firm* — Lempia Summerfield Katz LLC

(57) ABSTRACT

A display includes a substrate, a plurality of planar emission structures supported by the substrate, an encapsulation layer extending across the plurality of planar emission structures to encapsulate the plurality of planar emission structures, and an optical component layer supported by the substrate. The optical component layer extends across the plurality of planar emission structures. The optical component layer is positioned relative to the plurality of planar emission structures such that light emitted by the plurality of planar emission structures encounters the optical component layer. The optical component layer includes a plurality of discontinuities. Each discontinuity of the plurality of discontinuities is laterally positioned between a respective pair of adjacent planar emission structures of the plurality of planar emission structures.

20 Claims, 3 Drawing Sheets

(56) References Cited

U.S. PATENT DOCUMENTS

| | | | |
|---|---|---|---|
| 7,301,280 | B2 | 11/2007 | Su et al. |
| 7,545,094 | B2 | 6/2009 | Choi et al. |
| 7,798,803 | B2 | 9/2010 | Chang |
| 7,875,895 | B2 | 1/2011 | Kwack et al. |
| 7,915,821 | B2 | 3/2011 | Kang |
| 7,934,968 | B2 | 5/2011 | Tsai et al. |
| 8,063,561 | B2 | 11/2011 | Choi et al. |
| 8,525,962 | B2 | 9/2013 | Ben-Shalom |
| 8,729,797 | B2 | 5/2014 | Lee et al. |
| 8,796,704 | B2* | 8/2014 | Hatta .................. H01L 27/3213 257/89 |
| 8,841,840 | B2 | 9/2014 | Jung et al. |
| 8,860,299 | B2 | 10/2014 | Seong |
| 8,940,208 | B2 | 1/2015 | Liu et al. |
| 2010/0013745 | A1* | 1/2010 | Kim ....................... G06F 3/0412 345/76 |
| 2010/0089636 | A1 | 4/2010 | Ramadas et al. |
| 2011/0132449 | A1 | 6/2011 | Ramadas et al. |
| 2012/0161618 | A1 | 6/2012 | Kwon et al. |
| 2012/0180843 | A1* | 7/2012 | Park ................... H01L 31/0201 136/244 |
| 2012/0186625 | A1* | 7/2012 | Jee ....................... H01L 31/046 136/244 |
| 2013/0217168 | A1 | 8/2013 | Hartmann et al. |
| 2013/0248890 | A1 | 9/2013 | Yoo |
| 2014/0138640 | A1 | 5/2014 | Kim et al. |
| 2014/0152174 | A1* | 6/2014 | Wang .................. H01L 51/5253 313/511 |
| 2014/0159003 | A1 | 6/2014 | Shin |
| 2014/0353625 | A1* | 12/2014 | Yi ....................... H01L 51/5253 257/40 |
| 2014/0374704 | A1 | 12/2014 | Jang et al. |
| 2015/0115253 | A1* | 4/2015 | Ha ....................... H01L 27/3248 257/40 |
| 2016/0028043 | A1* | 1/2016 | Kwon ................. H01L 51/5253 257/40 |
| 2016/0284774 | A1* | 9/2016 | Zhang ..................... H01L 21/77 |

OTHER PUBLICATIONS

Dalong Zhao, "Plasma-Enhanced Atomic Layer Deposition Zinc Oixde Flexible Thin Film Electronics", A Dissertation in Electrical Engineering, The Pennsylvania State University, Dec. 2010, 169 pages.

L. Zhao et al., "Novel Method for Fabricating Flexible Active Matrix Organic Light Emitting Diode (AMOLED) Displays", HP, Sep. 21, 2011, 5 pages.

Ma Ruiqing et al., "Flexible AMOLEDs for Low-Power, Rugged Applications", Information Display, Feb. 2010, 9 pages.

Ravi Kumar. et al., "Development of New Hybrid Polymer for Efficient OLED", International Journal of Advanced Research in Electrical, Electronics and Instrumentation Engineering, Sep. 2014, 5 pages, vol. 3, Issue 9.

Seok-Beom Yoon et al., "High-Efficiency Red Polymer LED's Based upon Fluorescent Dye Dopants"', Journal of the Korean Physical Society, Feb. 2002, pp. 330-334, vol. 40, No. 2.

"International Search Report & Written Opinion Issued in PCT Application No. PCT/US2016/059810", dated Feb. 10, 2017, 11 Pages.

* cited by examiner

PATTERNING OF OLED DISPLAY STACKS

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
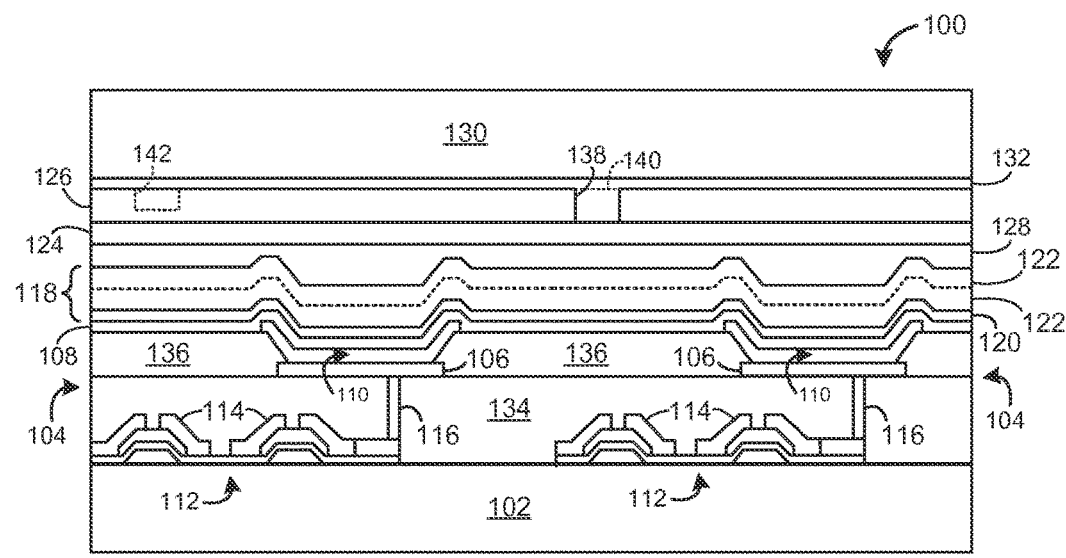
FIG. 1 is a partial, schematic, cross-sectional view of a display having a display stack with an optical component layer patterned at a sub-pixel level in accordance with one example.

The embodiments of the disclosed devices may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION

Displays include encapsulation layers to protect emissive components of the displays from moisture, oxygen, and/or other contaminants. Thin film encapsulation (TFE) is used as an alternative to glass seal encapsulation in the interest of fabricating thinner, flexible displays. TFE layers are repeated for redundancy in a stacked arrangement over the emissive components, such as organic light emitting diode (OLED) structures of active matrix OLED (AMOLED) devices. But with each additional layer of the stack, the stack becomes more rigid. The increased rigidity leads to an increased chance of delamination or other structural defect development upon bending of the display. TFE layers and other layers of a display stack, such as optical component layers, are therefore unfortunately prone to cracking or other failure during fabrication, as well as during use scenarios involving repeated bending.

One or more layers of a display stack are patterned to provide stress relief and thereby prevent or reduce cracking or other faults. The patterning breaks up one or more layers of the display stack into segments or sections. The patterning may include gaps, notches, grooves, or other discontinuities configured to relieve stress during bending. With lower stress levels in its constituent layers, the display stack is less likely to develop faults over time due to repeated flexure.

Without the discontinuities, the display stack may be rather brittle or fragile. In some cases, the display stack includes multiple pairs (or dyads) of organic and inorganic TFE layers stacked upon one another. Redundancy in the TFE layers helps avoid exposing emissive components of the display to moisture and oxygen from the ambient environment. Protection may thus be provided even if an individual encapsulation layer has a defect, such as a pinhole or other artifact of the fabrication process. Even if multiple layers have defects, the defects are likely not aligned or co-located, leaving a circuitous route for the moisture and oxygen. However, the redundancy comes at a cost, because the display becomes increasingly prone to failure, given that each additional layer increases the rigidity, and, thus, fragility, of the display stack.

The patterning may involve or extend to an optical component layer of the display stack. In OLED examples, optical component layers are included to provide a circular polarizer. The display stack may thus include a number of laminated or otherwise coated layers arranged in a circular polarizer stack (or sub-stack). The circular polarizer and/or other optical component layer(s) may further stiffen the display stack, leading to additional stresses during bending. The stresses may be relieved through patterning one or more of the optical component layers. In some cases, the patterning of the display stack involves patterning the optical component layer(s) rather than the encapsulation layers.

Patterning of the display stack may lead to more widespread use of TFE encapsulation and decreased reliance on glass seal encapsulation. The replacement of glass seal encapsulation may also be useful for reasons in addition to its lack of flexibility. For instance, glass seal encapsulation often has low reliability, undesirable thickness, and increased border size. Thinner and otherwise smaller devices may thus be realized, along with higher production yields.

The display stack may be patterned at the sub-pixel level or the pixel level. For example, a discontinuity may be present between each pair of adjacent sub-pixels of each pixel of the display. Alternatively, the sub-pixel patterning may be limited or selective, in which case some pairs of adjacent sub-pixels do not have a discontinuity. Patterning at the pixel level may also be limited or universal. In the latter case, a discontinuity is disposed between each pair of adjacent pixels. In the former case, discontinuities are disposed in various selective or limited manners, such as between groups of pixels.

The patterning of the display stacks may enable more widespread use of flexible displays. For instance, the patterning may improve the longevity and production yield of flexible displays, such as AMOLED displays. A variety of display applications may be supported. The extent to which the display is flexible may thus vary. The extent to which the display undergoes flexure during use may thus also vary. For example, the flexure may be limited to a single bending of the display during fabrication to reach a desired amount of curvature. The patterning may thus be useful with displays not intended to be repeatedly bent or flexed during use. For instance, in some cases, the patterning may be useful in connection with displays that occasionally experience deformation during use and/or fabrication. An example of such a display is a curved television or monitor.

Although described in connection with OLED examples, the patterned display stacks may be useful in connection with a variety of different types of displays. For example, other types of planar emission structures may be used as light sources. The planar emission structures may be presently known or hereafter developed. A number of other aspects, features, or elements of the displays may also vary. For instance, the displays may not include a touch sensor in some cases.

A number of exemplary displays are described herein. Each exemplary display has one or more layers of the display stack patterned. A number of further exemplary displays may be defined through selectively combining the patterning of two or more of the described exemplary displays in various ways. For instance, a further exemplary display may include the sub-pixel-level patterning of the encapsulation layers of a first exemplary display with the pixel-level patterning of one or more optical component layers of a second exemplary display. Still further exemplary displays may be provided by changing the level (or degree or resolution) at which the patterning is implemented. For instance, the resolution of the patterning of any one or more layers of the display stack may be switched from a respective one of the levels (e.g., sub-pixel, sub-pixel group, pixel, and pixel group levels) to another one of the levels.

FIG. 1 depicts a display 100 in which one or more optical component layers of the display stack are patterned. In this example, the optical component layer(s) relate to or define a circular polarizer. The circular polarizer patterning is either at the sub-pixel level or at the sub-pixel group level. In the former case, a discontinuity is present between each pair of adjacent sub-pixels. In the latter case, discontinuities are not present between each such pair, but rather present between adjacent groups of sub-pixels. Each sub-pixel group may or may not correspond with a respective pixel of the display 100. For example, every other pair of adjacent sub-pixels may have a discontinuity.

The display 100 includes a backplane or other substrate 102 and an array of planar emission structures 104 supported by the substrate 102. The substrate 102 may be flexible. Exemplary materials for the substrate 102 include polyimide, flexible glass, flexible metal foil, polyethylene terephthalate ("PET"), polyethylene naphthalate ("PEN"), poly(methyl methacrylate) (PMMA), polycarbonate, or any other flexible material. Each planar emission structure 104 may form or provide a sub-pixel. Each sub-pixel may be an OLED sub-pixel, e.g., a sub-pixel directed to providing red, green, blue and/or other colored light for a respective pixel. Other types of planar emission structures may be used, including, for instance, polymer LEDs (PLEDs), quantum dot LEDS (QD-LEDs), or thin film electroluminescent devices. Alternatively or additionally, the sub-pixel may be configured to provide white light.

In the example of FIG. 1, each planar emission structure 104 includes a lower electrode 106, an upper electrode 108, and an OLED stack 110 disposed between the electrodes 106, 108. The upper electrode 108 is composed of a transparent or partially transparent conductive material. In this case, the upper electrode 108 is provided as a layer that extends across multiple planar emission structures 104. The layer of the upper electrode 108 may or may not be patterned for selectively addressing a subset of the sub-pixels or pixels of the display 100. A respective one of the lower electrodes 106 may be provided for selectively addressing each sub-pixel or a respective group of sub-pixels. The layers of the planar emission structure 104 are depicted in FIG. 1 in simplified form for ease in illustration. For instance, the layers may not be planar as shown, but may instead be conformal to varying extents to the underlying structures. Also, at least a portion of the layers may extend beyond the pixel walls or boundaries.

Each sub-pixel includes respective thin film transistor (TFT) circuitry 112. In this example, the TFT circuitry 112 includes a pair of transistors 114 disposed on the substrate 102. The TFT circuitry 112 controls the voltage applied to the lower electrode 106 of the sub-pixel. In this example, one of the transistors 114 is connected to the lower electrode 106 via an interconnect via 116. The electrical connections involving the TFT circuitry 112 are depicted schematically and in simplified form, and thus may vary considerably from the example shown.

The display 100 includes a number of encapsulation layers 118 that extend across the planar emission structures 104. Each encapsulation layer 118 may conformably cover the pixel well. The encapsulation layers 118 may form a barrier that protects the planar emission structures 104 from moisture, oxygen, and/or other contaminants, e.g., a water vapor transmission barrier. Each encapsulation layer 118 is supported by the substrate 102. In some cases, the display 100 includes a multi-layer encapsulation framework in which multiple encapsulation layers 118 are arranged in a stack to provide redundancy. In this example, the encapsulation layers 118 include a bottom layer 120 and one or more additional layers 122 stacked or otherwise disposed over the bottom layer 120.

In some cases, the encapsulation layers 120, 122 may present alternating layers of inorganic and organic materials. For example, the layer 120 may be or include an inorganic layer, such as silicon dioxide, silicon nitride, or silicon oxynitride. The next encapsulation layer, the lowest of the additional layers 122, may then be or include an organic layer, such as cross-linkable polymeric layer including acrylates (e.g. polymethyl methacrylate, PMMA) or polyesters (e.g., polyethylene terephthalate, PET). In the example of FIG. 1, additional encapsulation layers 122 are provided as a dyad, in which, for example, an organic layer and an inorganic layer are paired. As a result, an organic encapsulation layer is sandwiched between an upper inorganic encapsulation layer and the inorganic material of the bottom layer 120. The encapsulation layers 120, 122 may include any number (e.g., seven) of dyads. In other cases, the bottom layer 120 includes or is composed of materials other than inorganic materials.

The constituent layers of each dyad may have relative benefits. In inorganic-organic examples, the inorganic layers of the dyads have lower water permeation. The organic layers are smoother, and accordingly less prone to cracks and other defects than the inorganic layers.

The encapsulation layers 120, 122 may be formed via various processes. For example, the inorganic layers may be deposited via inorganic coating methods, such as chemical vapor deposition (CVD) processes (e.g., plasma-enhanced CVD, or PECVD), atomic layer deposition (ALD) and physical vapor deposition (PVD) processes. The organic layers may be deposited via organic/polymer coating methods, such as vacuum-based deposition of monomeric/oligomeric precursors followed by ultraviolet or e-beam curing. Solution-based ink jet, nozzle jet, organic vapor phase deposition, and other methods may also be used.

The encapsulation is not limited to multiple dyad arrangements. A variety of other stack arrangements may be used, including those that include non-paired numbers of encapsulation layers (inorganic and/or organic) and/or different types of materials and/or layers. For instance, one or more of the layers may be a composite layer in which organic material is suspended, embedded, or otherwise integrated within an inorganic material, or vice versa. Examples of single-layer solutions include inorganic or carbon-based (e.g., graphene platelets or nanoribbons) material in a polymeric binder. Alternatively, the single layer solution may be based on an inorganic polymer system. Such single layer solutions systems may or may not involve curing for polymerization, or cross-linking, via ultraviolet light, e-beam, or other methods.

The display 100 includes a number of optical component layers 124, 126 that extend across the planar emission structures 104. Each optical component layer 124, 126 is supported by the substrate 102. The optical component layers 124, 126 are positioned relative to the planar emission structures 104 such that light emitted by the planar emission structures 104 encounters the optical component layer(s) 124, 126. In this example, the light may encounter the optical component layer(s) 124, 126 after passing through the encapsulation layer(s) 120, 122. The arrangement of the optical component layers 124, 126 may vary from the example shown. For example, one or more of the optical component layers 124, 126 may be disposed between the encapsulation layer(s) 120, 122 and the planar emission structures 104. Fewer, alternative, or additional optical component layers may be provided.

Each optical component layer 124, 126 may be configured to implement or perform a respective optical function. The optical function achieves an intended optical result or operation, as opposed to layers that introduce an unintended or incidental effect. In the example of FIG. 1, the optical component layers 124, 126 are configured to effectuate a respective optical function upon ambient light directed toward the planar emission structures 104. In OLED cases, the optical component layers 124, 126 collectively form a circular polarizer. In such cases, the optical component layer 124 is a quarter wave plate, such that the function of the optical component layer 124 is a quarter-wave retarder. To complete the circular polarizer for ambient light incident upon the display 100, the optical component layer 126 is configured to act as a linear polarizer. The ambient light is thus circularly polarized by the optical component layers 124, 126 before reflection off of an internal layer or structure, such as the lower electrode 106. When the circularly polarizer light again encounters the circular polarizer, the linear polarizer blocks any further transmission of the ambient light. Therefore, taken together, the optical component layers 124, 126 minimizes or prevents the reflection of ambient light by the display 100. The component layers of the circular polarizer may differ in other cases. For example, one or more half-wave retarders may be used instead of or in addition to a quarter-wave retarder.

Additional or alternative optical component layers and/or functions may be provided. For example, one or more optical component layers may be directed to implementing a filtering function, such as color filtering. The optical component layer(s) may or may not be continuous or uniform across the planar emission structures 104. For example, one or more of the optical component layers may be patterned to implement the optical function(s) on a sub-pixel basis, on a pixel basis, or in any other selective manner.

An optically clear adhesive (OCA) layer 128 may be used to adhere the optical component layers 124, 126 to the topmost encapsulation layer 122. The OCA layer 128 may include acrylate based materials, rubbers, silicones, polyolefins, hot melt adhesives, thermoplastic polymers, or curable adhesives, but any one or more materials may be used to form the OCA layer 128. The OCA layer 128 may be or include a film that planarizes the surface to which the optical component layers 124, 126 are attached. In the example of FIG. 1, the encapsulation layers 118 are conformal and, consequently, retain the contour of the planar emission structures 104. The OCA layer 128 may be spun onto, or otherwise coat, the encapsulation stack to fill in depressions between the planar emission structures 104. In other cases, one or more planarization layers may be provided in addition to the layer(s) providing adhesion.

In some cases, the optical component layers 124, 126 are deposited or otherwise formed on another substrate (e.g., a carrying wafer) before transfer to the backplane or substrate 102. The optical component layers 124, 126 are separated from the other substrate during fabrication due to the adhesion strength of the OCA layer 128 being greater than the strength of the attachment to the other substrate.

In the example of FIG. 1, the display 100 includes a transparent cover 130 that forms a front surface, or top face, of the display 100. The transparent cover 130 may be flexible to allow bending of the display 100. The transparent cover 130 may be composed of, or include, one or more transparent materials to allow transmission of light generated by the planar emission structures 104. For example, the transparent cover 130 may include or be composed of a clear polymer film, such as hard-coated polymers (e.g., polycarbonates, PET, PEN, TAC, PMMA, and others). The transparent cover 130 may be attached to the other components of the display 100 via an adhesive layer. In this example, another OCA layer 132 is used. Alternatively or additionally, an adhesive material is provided to secure the transparent cover 130 along a periphery of the display 100. For example, the transparent cover 130 may be attached to a bezel, frame, or other structural component of the display 100 along the periphery.

The display 100 may include one or more planarization layers. In the example of FIG. 1, a planarization layer 134 is disposed between the transistors 114 of the TFT circuitry 112 and the layer occupied by the lower electrode 106 of the planar emission structures 104. The planarization layer 134 establishes a flat surface (or relatively or sufficiently flat) for fabrication of the OLED stack 110 and/or other light generating components of the planar emission structures 104. The planarization layer 134 may include one or more dielectric materials, such as silicon nitride or a curable resin. The planarization layer 134 may be patterned to support the formation of the via interconnects 116 and/or other metal layers or other components of the TFT circuitry 112.

The display 100 may include other layers involved in the fabrication of the planar emission structures 104. For instance, a field dielectric layer 136 may define the active area for each planar emission structure 104. The field dielectric layer 136 is patterned to define a well or area in which the OLED stack 110 is formed. The field dielectric layer 136 may be composed of silicon dioxide, silicon nitride, and/or other dielectric materials.

The above-described layers of the display stack may collectively result in considerable thickness added to the display 100. For instance, the optical component layers 124, 126, any adhesive layers (e.g., the OCA layer 128), and any other layers or substrates may amount to a total added thickness of more than about 100 microns. Such added thickness may significantly limit the flexibility of the display 100. The flexibility may also be limited by the brittleness of the encapsulation layers 120, 122.

One or more of the above-described layers of the display 100 includes a number of discontinuities to provide stress relief. Each discontinuity breaks up the respective layer into segments. Each discontinuity thus acts as, or provides, a stress relief structure that decreases the likelihood of delamination, cracking, and/or other defects arising from bending of the display 100. In the example of FIG. 1, the optical component layer 126 includes a number of discontinuities 138. Each discontinuity 138 is laterally positioned between a respective pair of adjacent planar emission structures 104. In this case, each discontinuity 138 is configured as a gap in the optical component layer 126. The gap extends the entire depth of the optical component layer 126.

The discontinuities 138 in the optical component layer 126 are useful in cases in which the optical component layer 126 is a linear polarizer. In such cases, the linear polarizer may be considerably thicker than a number of the other layers of the display stack. For example, the linear polarizer may have a thickness that falls in a range from about 50 microns to about 300 microns in polyvinyl alcohol-based polarizers.

The discontinuities 138 may be filled or empty. An empty discontinuity 138 may have air or another gas present therein. In the example of FIG. 1, the gap is filled with a portion 140 of the adhesive material of the OCA layer 132. In other cases, the gap may be filled with other materials. The material(s) used to fill the gap may be more elastic or flexible than the material of the optical component layer 126.

The material(s) used to fill the discontinuities 138 may be index-matched to the material of the layer in which the discontinuity 138 is formed. Matching refractive indices may be useful despite positioning the discontinuities 138 between the planar emission structures 104 (as opposed to, for instance, directly over one of the planar emission structures 104). Matching refractive indices need not be identical and, instead, be offset from one another to an extent that does not appreciably affect the output of the display 100.

The discontinuities 138 may be formed during or after the deposition of the optical component layer 126. In some cases, the discontinuities 138 are formed via a shadow mask used to deposit and pattern the optical component layer 126. In other cases, the discontinuities 138 are formed via a chemical etch procedure. Alternatively or additionally, a mechanical procedure (e.g., a sawing procedure) is used to form the discontinuities 138. In still other cases, chemical-mechanical procedures are used.

A variety of other fabrication procedures may be used to produce, in some cases, alternatives to the pattern arrangements shown in FIG. 1. For example, a continuous quarter-wave retarder layer may be laminated onto the device encapsulation stack to form the optical component layer 124. The optical component layer 124 may then be patterned (via, e.g., cutting or etching). Lamination or coating of the optical component layer 126 (e.g., linear polarizer layer) may then be implemented to produce a circular polarizer stack in which one or more intermediate optical component layers are patterned despite the continuous nature of the other optical component layer(s). In still other cases, one or more optical component layers 124, 126 may be patterned via ink-jet or other procedures. The optical component layers may alternatively or additionally be composed of, or otherwise include, materials that self-align, e.g., along desired polarization axes.

FIG. 1 also depicts another exemplary discontinuity 142 in the optical component layer 126. The discontinuity 142 may also be laterally positioned between a respective pair of adjacent planar emission structures 104. Each discontinuity 142 is configured as a notch or groove in the optical component layer 126. Each notch does not extend the entire depth of the optical component layer 126. The display 100 may have any combination of the discontinuities 138, 142. The notches may be filled or empty as described above in connection with the discontinuities 138. The notches may be formed via the same fabrication procedures described above in connection with the discontinuities 138.

The shape of the discontinuities 138, 142 may vary from the example shown in FIG. 1. For instance, the discontinuities may not have upright sidewalls and/or a flat bottom. In some cases, the sidewalls may be slanted or oriented at other angles. The orientation of the sidewalls may vary based on the manner in which the discontinuities 138, 142 are formed. For instance, some etch procedures may have a preferential direction for a given material. The discontinuities 138, 142 may thus have a triangular cross-section or a trapezoidal cross-section. The discontinuities 138, 142 may not have a symmetrical shape. Any shape that provides an effective amount of stress relief may be used.

Each discontinuity 138, 142 may be elongate, e.g., along the dimension perpendicular to the plane of FIG. 1. The elongate discontinuities 138, 142 may be oriented along respective lines about which the substrate 102 is bendable. Further information is provided in connection with the example of FIG. 4.

The display 100 may have any number of the discontinuities 138, 142. In some cases, a respective one of the discontinuities 138, 142 is disposed between each respective pair of adjacent planar emission structures 104. In other cases, the discontinuities 138, 142 are selectively distributed across the display. Thus, multiple pairs of adjacent planar emission structures 104 do not have one of the discontinuities 138, 142 disposed therebetween.

In the example of FIG. 1, only a single layer of the display 100 has discontinuities. The other layers of the display stack may thus be continuous throughout the display area (e.g., the area in which the planar emission structures 104 are disposed). In other examples, one or more of the other optical component and encapsulation layers have discontinuities.

Figure 2:
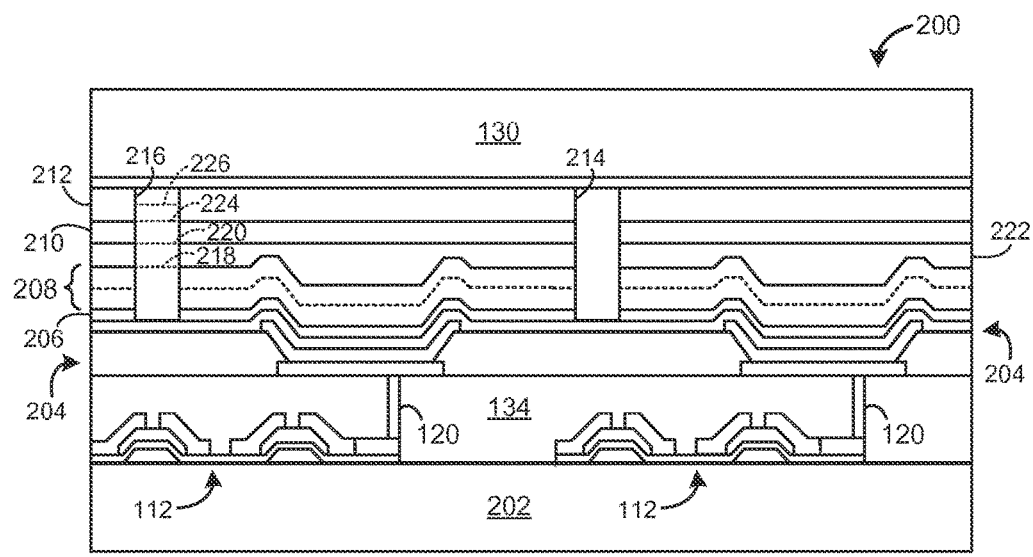
FIG. 2 is a partial, schematic, cross-sectional view of a display having multiple layers of a display stack patterned at a sub-pixel level in accordance with one example.

FIG. 2 depicts another example of a display 200 having discontinuities in the display stack to provide relief from stress arising from flexure. As in the example of FIG. 1, the display 200 includes a flexible substrate 202, and a number of planar emission structures 204 (e.g., OLED structures) supported by the substrate 202. The display 200 also similarly includes a number of encapsulation layers 206, 208 and optical component layers 210, 212 supported by the substrate 202 and extending across the planar emission structures 204. The encapsulation layers 206, 208 and the optical component layers 210, 212 may be positioned relative to the planar emission structures 204 as in the examples described above, such that light emitted thereby passes through the encapsulation layers 206, 208 before encountering the optical component layers 210, 212. The display 200 may have a number of other components in common with the example of FIG. 1, including, for instance, the various elements of the TFT circuitry 112, the transparent cover 130, and the planarization layer 134. The planar emission structures 204 may also be configured similarly to the structures of the examples described above.

The example of FIG. 2 differs from the above-described examples in connection with the location, extent and/or type of discontinuities in the display stack. In this case, discontinuities are present in both the encapsulation and optical component layers. Discontinuities 214 extend throughout the encapsulation layers 206, 208 and the optical component layers 210, 212. Each discontinuity 214 is configured as a gap in each of the encapsulation and optical component layers. In the example of FIG. 1, the discontinuities 214 also extend through the lowest encapsulation layer 206, which may be, for example, an inorganic layer in contact with the upper electrode of the planar emission structure 204.

The discontinuities 214 may be formed as described above in connection with FIG. 1. An etch-based, saw-based, and/or other process may define the discontinuities 214 after deposition, attachment, or other disposition of the optical component layers 210, 212. For instance, the discontinuities 214 may be formed after the optical component layers 210, 212 are transferred to the display stack supported by the substrate 202. Alternatively, the discontinuities 214 in the encapsulation layers 206, 208 may be formed before the transfer separately from the discontinuities 214 in the optical component layers 210, 212.

The etch-based, saw-based, and/or other processes may be configured to vary the extent of the discontinuities 214. For instance, the process may be configured to allow the lowest encapsulation layer 206 to be, or remain, continuous in some cases. In other examples, the lowest encapsulation layer 206 may have grooves or notches rather than gaps. In still other cases, any number of encapsulation layers of examples having multiple dyads of inorganic-organic TFE pairs may also be continuous.

FIG. 2 also depicts an exemplary discontinuity 216 to show various degrees to which the display stack may be discontinuous. In each case, the discontinuity 216 is present in the encapsulation layers 206, 208. Dashed lines are used to show a number of various options. In one option indicated by dashed lines 218, 220, the discontinuity 216 is present in the encapsulation layers 206, 208, but does not extend through either of the optical component layers 210, 212. The dashed lines 218, 220 are also representative of the optional continuity of an OCA layer 222 or other intermediary layer disposed between the uppermost encapsulation layer 208 and the lowermost optical component layer 210 (e.g., a quarter-wave retarder). In another option, the discontinuity 216 is present in the encapsulation layers 206, 208, as well as one of the optical component layers 210, as shown by a dashed line 224. In still further options, the discontinuity 216 is partially present (e.g., as a groove or notch) in one of the optical component layers, such as the optical component layer 212, as represented by dashed line 226. As described above, an adhesive material, such as the adhesive material of the OCA layer 222, may be used to fill any of these optional discontinuities 216.

The portions of the discontinuities 216 may not be aligned, as described above in connection with the discontinuities 214. Non-alignment may be present in cases in which the discontinuities 216 are formed in the encapsulation layers 206, 208 separately from the discontinuities 216.

The display 200 may be configured with the discontinuities 214, one or more of the various optional discontinuities 216, or any combination thereof.

The discontinuities 214 are positioned between adjacent pairs of the planar emission structures 204. In the example of FIG. 2, the discontinuities 214 are aligned with one another. The discontinuities 214 are thus positioned such that the encapsulation and optical component layers have gaps in the same lateral positions. In other cases, the discontinuities 214 in the encapsulation layers are not aligned with the discontinuities in the optical component layers.

As in the examples described above in connection with FIG. 1, the discontinuities 214 may be universally or selectively distributed across the display 100. Thus, in the universal cases, each adjacent pair of planar emission structures 204 has a respective one of the discontinuities 214 disposed therebetween. In the selective cases, various pairs of adjacent planar emission structures 204 do not have one of the plurality of discontinuities disposed therebetween.

Defining the discontinuities 214, 216 during the deposition or other formation of the display stack layers may self-align one or more subsequent layers. For instance, a difference in surface characteristics (e.g., surface energy) may arise when organic layers (and/or inorganic layers) are coated in a pixelated pattern. In some cases, substantially different surface wetting properties may arise between the pixelated organic layer and an underlying inorganic layer, such as a non-patterned inorganic sub-layer. The different surface characteristics may be used to pattern-wise deposit the inorganic layer. Conformal or preferential deposition of the inorganic layer may thus be achieved.

Figure 3:
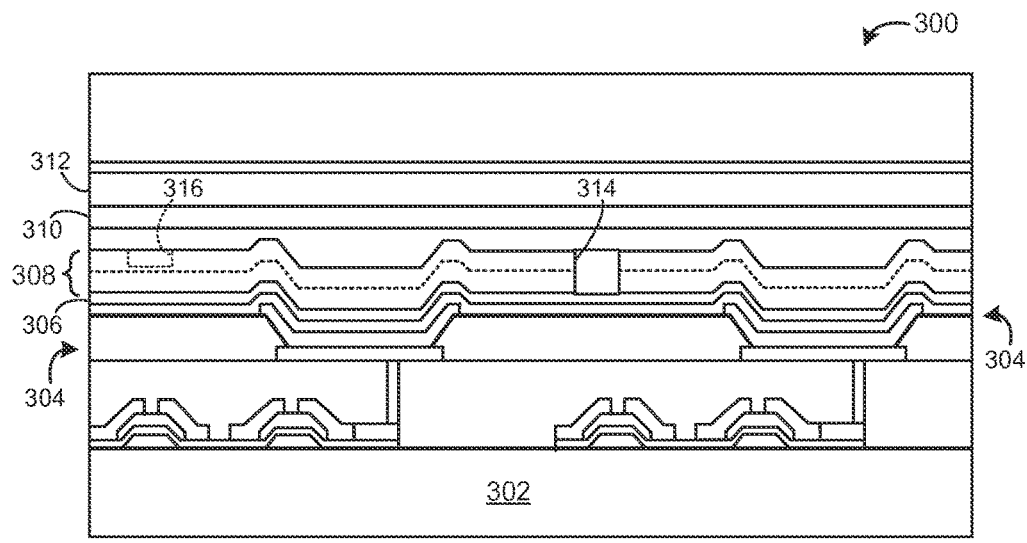
FIG. 3 is a partial, schematic, cross-sectional view of a display having a number of encapsulation layers of a display stack patterned at a sub-pixel level in accordance with one example.

FIG. 3 depicts yet another example of a display 300 having discontinuities in the display stack to provide relief from stress arising from flexure. As in the examples described above, the display 300 includes a flexible substrate 302, and a number of planar emission structures 304 (e.g., OLED structures) supported by the substrate 302. The display 300 also similarly includes a number of encapsulation layers 306, 308 and optical component layers 310, 312 supported by the substrate 302 and extending across the planar emission structures 304. The encapsulation layers 306, 308 and the optical component layers 310, 312 may be positioned relative to the planar emission structures 304 as in the examples described above, such that light emitted thereby passes through the encapsulation layers 306, 308 before encountering the optical component layers 310, 312. The display 300 may have a number of other components in common with the above-described examples. The planar emission structures 204 may also be configured similarly to the structures of the above-described examples.

The example of FIG. 3 differs from the above-described examples in connection with an extent to which discontinuities 314 are present in the encapsulation layers 306, 308. In this case, the encapsulation layer 306 in contact with the planar emission structures 304 (e.g., an upper electrode thereof) may not have any gaps, notches, or other discontinuities between adjacent planar emission structures 304. The lowest or bottom encapsulation layer 306 may thus be continuous between adjacent planar emission structures 304. Relative to the planar emission structures 304, the encapsulation layer 306 is effectively a continuous encapsulation layer. As described above, the lowest encapsulation layer 306 may be or include an inorganic dielectric layer, such as silicon dioxide or silicon nitride, but organic layers or materials may be additionally or alternatively be used.

The discontinuities 314 may be present in each of the other encapsulation layers 308. As described above, the number of other encapsulation layers 308 may vary from a single TFE layer to, for instance, any number of TFE dyads. The extent to which the discontinuities 314 are present in the other encapsulation layers 308 may also vary. FIG. 3 shows an example in which a discontinuity 316 does not extend through the entire, collective depth of the other encapsulation layers 308. The discontinuity 316 may be configured as a gap or a notch. For instance, the discontinuity 316 may be a gap in some of the encapsulation layers 308, and then a notch or groove in the lowest of the encapsulation layers 308 having the discontinuity 316.

Figure 4:
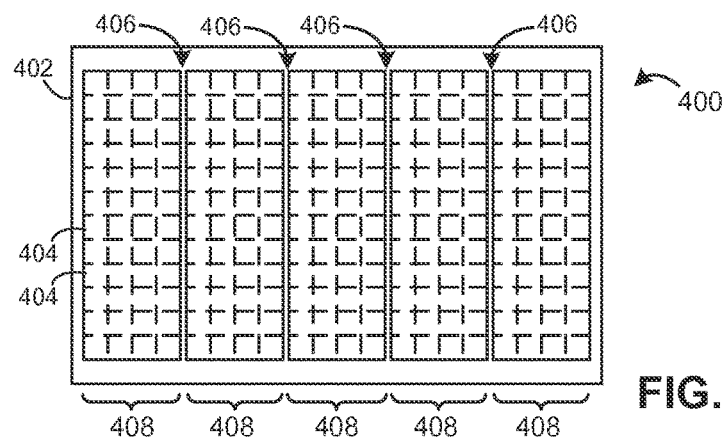
FIG. 4 is a partial, schematic, plan view of a display having a display stack patterned at a pixel group level in accordance with one example.

FIG. 4 depicts a display 400 having a selective, rather than universal, discontinuity arrangement. The display 400 includes a substrate 402 having a number of pixels 404. Each pixel 404 may include a number of sub-pixels. Each sub-pixel, in turn, may include various structures, including, for instance, planar emission structures and TFT circuitry. The area in which the respective structures of each pixel 404 are disposed is demarcated by dashed lines.

As in the examples described above, the structures of each pixel 404 are encapsulated and otherwise covered by a number of layers of a display stack. The display stack of the display 400 may include any number of encapsulation and/or other layers. For instance, a number of layers may be optical component layers, each of which is configured to implement a respective optical function. Discontinuities 406 are present in one or more of the layers of the display stack.

The plan or layout view of FIG. 4 depicts how the discontinuities 406 are disposed between some, but not all, of the pixels 404. In this example, the discontinuities 406 are present between every fourth adjacent pair of pixels 404. Many pairs of adjacent pixels (and the planar emission structures thereof) thus do not have one of the discontinuities 406 disposed therebetween. Other discontinuity arrangements may be used. For instance, the discontinuities 406 may be selectively disposed in irregular patterns. For example, the discontinuities 406 may be more prevalent near edges and/or other areas in which stresses from flexure are more likely.

Each discontinuity 406 is configured as a gap and/or notch that runs along one of a number of parallel lines across the substrate 402. In this example, the discontinuity lines are oriented as columns to establish a number of columns 408 for the display 400. The discontinuities 406 and the columns 408 facilitate bending of the display 400 along lines in parallel with the lateral direction. The bending may, in turn, allow the display 400 to be, for instance, rolled up or folded in the direction orthogonal to the lateral direction in cases in which the substrate 402 is considerably flexible.

In other cases, the discontinuities 406 are oriented along row lines such that rows are defined for the display 400. Orienting the discontinuities 406 along row lines may be useful if the display 400 is likely to be bent along a lateral direction parallel to the row lines. In still other cases, the discontinuities 406 are combined with further discontinuities such that discontinuities are provided along both column and row lines. The display 400 may thus be capable of relieving stresses arising from bending along multiple directions.

The discontinuity patterns may also vary across the display area. Any combination of the foregoing examples may thus be provided. For example, the discontinuities 406 may be disposed along both column and row lines near the center of the display area, and along one of the column or row lines near the edges of the display area.

FIG. 4 depicts an example in which the discontinuity arrangement is provided at the pixel level rather than the sub-pixel level. The discontinuities 406 thus define respective groups of pixels 404. Each pixel group is disposed in a respective one of the columns 408.

In other cases, the discontinuities 406 define groups of sub-pixels. The sub-pixels of a group may or may not be associated with the same pixel 404. Discontinuity arrangements at the sub-pixel level may vary as described above in connection with selective pixel-level discontinuity arrangements. For example, the sub-pixel discontinuity arrangements may be regular or irregular.

Figure 5:
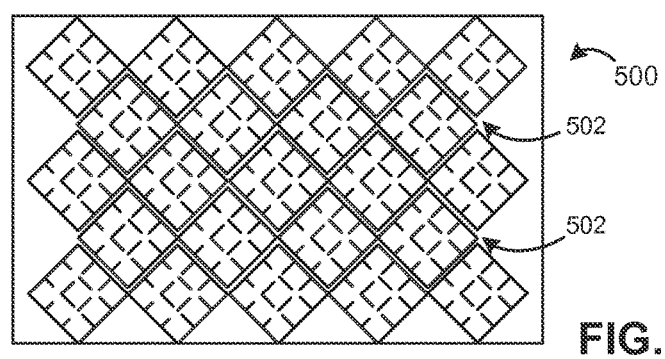
FIG. 5 is a partial, schematic, plan view of a display having a display stack patterned at a pixel group level in accordance with another example.

FIG. 5 depicts another exemplary display 500 having a selective discontinuity arrangement at the pixel level. In this example, the display 500 has discontinuities 502 in one or more layers of the display stack oriented roughly along diagonal lines. The diagonal lines correspond with the diamond-shaped areas of the pixels. The example of FIG. 5 accordingly shows that the discontinuity lines may be oriented at any angle with respect to the boundaries of the display area. The discontinuity arrangement of FIG. 5 also shows that the extent (e.g., length) of the discontinuity lines may vary from examples in which the lines extend across the entire lateral extent of the display area. In this example, the discontinuities 502 may be disposed in segments that are roughly, but not exactly, aligned. As shown, each segment corresponds with one of the pixel groups separated by the discontinuities 502.

The shape, orientation, size, and other characteristics of the sub-pixel areas, the pixel areas, and the pixel group areas may vary from the examples described above. The shape, orientation, size, and other characteristics of the discontinuities between such areas may thus vary accordingly.

The examples described above provide either pixel- or sub-pixel level encapsulation and/or other display stack patterning involving, for instance, one or more optical component layers. The pixel- or sub-pixel patterning is provided via discontinuities in one or more layers of the display stack. The pixel-level patterning may involve a respective discontinuity between individual pixels or groups of pixels. Similarly, the sub-pixel patterning may involve a respective discontinuity between individual sub-pixels or groups of sub-pixels.

The discontinuities are useful in preventing cracking in the display stack. The encapsulation and/or other layer(s) may be brittle and, thus, prone to cracking. The cracking may arise from imperfections resulting from, for instance, the process in which the encapsulation and/or other layers are formed, such as shadow mask processes. The micro-sized structures formed via patterning of the encapsulation and/or other layers of the display stack will reduce and/or minimize stresses arising from bending.

The display stack patterning may not include patterning of one or more encapsulation layers of the display stack. For instance, an inorganic encapsulation layer may be non-patterned and, thus, continuously disposed (e.g., without the discontinuities described above) over the entire display area. The continuous inorganic encapsulation layer may be the lowermost dielectric layer in a set of encapsulation layers (e.g., encapsulation dyads). Other sub-layers of the display stack may also be continuous.

The above-described patterning of the display stack may be achieved in various ways. The patterning may be implemented after the fabrication procedures directed to formation of the planar emission structures (e.g., OLED structures). For instance, the emission structures may be encapsulated by initially coating the structures with a continuous encapsulation stack, followed by an imprint or etching process to form the discontinuities. The cuts may be executed outside of the active areas of individual sub-pixels to avoid disrupting the continuity of the upper electrode of the emission structure stack. In some cases, the patterning may be provided via shadow masks or other mask-based procedures (e.g., photolithography). Coverage of the edges of the emission structures may therefore be achieved. Alternatively or additionally, one or more of display stack layers (patterned and/or non-patterned) may be formed via a barrier film or other procedure in which the layers are coated on a sacrificial substrate and pre-patterned before transfer to (e.g., lamination on) the display substrate.

Figure 6:
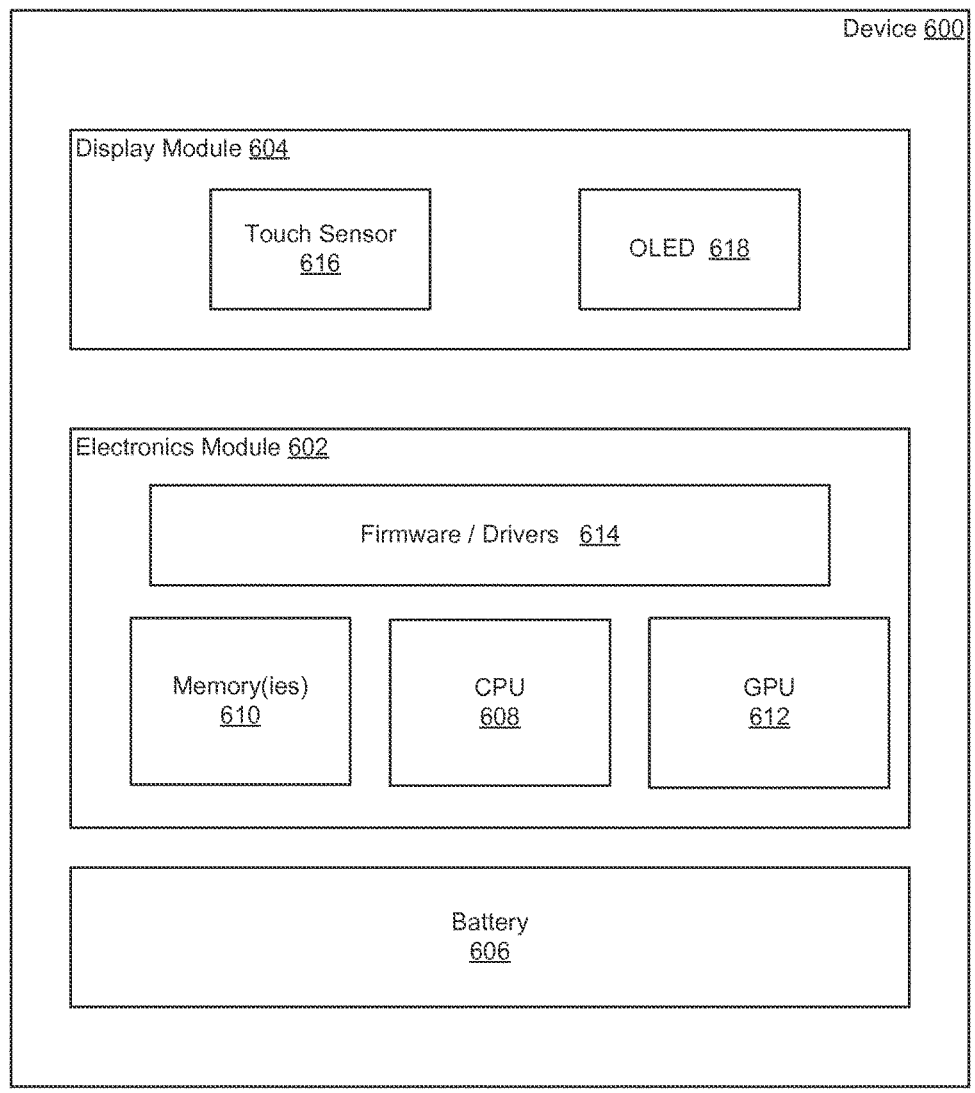
FIG. 6 is a block diagram of an electronic device having a display with one or more layers of a display stack configured in accordance with one example for implementation of the disclosed stress relief techniques or one or more components or aspects thereof.

FIG. 6 shows an exemplary electronic device 600 into which the above-described display stack patterning may be incorporated. The device 600 includes an electronics module 602 and a display module 604 (or subsystem), and a battery 606. The electronic device 600 may include additional, fewer, or alternative components. For example, the display module 604 may be integrated with the electronics module 602 and/or other components of the electronic device 600 to a varying extent. For instance, the electronics module 602 and/or the display module 604 may include a graphics subsystem of the electronic device 600. Any number of display modules or systems may be included. In this example, the device 600 includes a processor 608 and one or more memories 610 separate from the display module 604. The processor 608 and the memories 610 may be directed to executing one or more applications implemented by the device 600. The display module 604 generates a user interface for an operating environment (e.g., an application environment) supported by the processor 608 and the memories 610. The processor 608 may be a general-purpose processor, such as a central processing unit (CPU), or any other processor or processing unit. Any number of such processors or processing units may be included.

In the example of FIG. 6, the electronics module 602 includes a graphics processing unit (GPU) 612 and firmware and/or drivers 614. The GPU 612 may be dedicated to graphics- or display-related functionality and/or provide general processing functionality. Some of the components of the electronics module 602 may be integrated. For example, the processor 608, the one or more of the memories 610, the GPU 612, and/or the firmware 614 may be integrated as a system-on-a-chip (SoC) or application-specific integrated circuit (ASIC). The electronics module 602 may include additional, fewer, or alternative components. For example, the electronics module 602 may not include a dedicated graphics processor, and instead rely on the CPU 608 or other general-purpose processor to support the graphics-related functionality of the electronic device 600. The electronics module 602 may include additional memory (or memories) to support display-related processing.

In the example of FIG. 6, the display module 604 includes a touch sensor unit 616 and an OLED unit 618. The OLED unit 618 and other components of the display module 604 may be configured in accordance with any one or more of the examples described above. Additional, fewer, or alternative display components may be provided. For example, in some cases, the display module 604 does not include the touch sensor unit 616.

The device 600 may be configured as one of a wide variety of computing devices, including, but not limited to, handheld or wearable computing devices (e.g., tablets and watches), communication devices (e.g., phones), laptop or other mobile computers, personal computers (PCs), and other devices. The device 600 may also be configured as an electronic display device, such as a computer monitor, a television, or other display or visual output device.

In one aspect, a display includes a substrate, a plurality of planar emission structures supported by the substrate, an encapsulation layer extending across the plurality of planar emission structures, and an optical component layer supported by the substrate. The optical component layer extends across the plurality of planar emission structures. The optical component layer is positioned relative to the plurality of planar emission structures such that light emitted by the plurality of planar emission structures encounters the optical component layer. The optical component layer includes a plurality of discontinuities. Each discontinuity of the plurality of discontinuities is laterally positioned between a respective pair of adjacent planar emission structures of the plurality of planar emission structures.

In another aspect, a display includes a flexible substrate, a plurality of organic light emitting diode (OLED) structures supported by the flexible substrate, a plurality of encapsulation layers extending across the plurality of OLED structures to encapsulate the plurality of OLED structures, and an optical component layer supported by the flexible substrate. The optical component layer extends across the plurality of OLED structures. The optical component layer is positioned relative to the plurality of OLED structures such that light emitted by the plurality of OLED structures passes through the plurality of encapsulation layers before encountering the optical component layer. The optical component layer and/or a respective encapsulation layer of the plurality of encapsulation layers includes a plurality of discontinuities. Each discontinuity of the plurality of discontinuities is laterally positioned between a respective pair of adjacent OLED structures of the plurality of OLED structures. At least one encapsulation layer of the plurality of encapsulation layers is not patterned to be discontinuous between each respective pair of adjacent OLED structures of the plurality of OLED structures.

In yet another aspect, a display includes a flexible substrate, a plurality of organic light emitting diode (OLED) structures supported by the flexible substrate, a plurality of encapsulation layers extending across the plurality of OLED structures to encapsulate the plurality of OLED structures, and an optical component layer supported by the flexible substrate. The optical component layer extends across the plurality of OLED structures. The optical component layer is positioned relative to the plurality of OLED structures such that light emitted by the plurality of OLED structures passes through the plurality of encapsulation layers before encountering the optical component layer. The optical component layer and/or a respective encapsulation layer of the plurality of encapsulation layers includes a plurality of discontinuities. Each discontinuity of the plurality of discontinuities is laterally positioned between a respective pair of adjacent OLED structures of the plurality of OLED structures, but without every pair of adjacent OLED structures having a corresponding discontinuity of the plurality of discontinuities positioned therebetween.

In connection with any one of the aforementioned aspects, the systems, devices, and/or methods described herein may alternatively or additionally include any combination of one or more of the following aspects or features. Each discontinuity of the plurality of discontinuities is configured as a respective gap in the optical component layer. Each discontinuity of the plurality of discontinuities is configured as a respective notch in the optical component layer. The encapsulation layer is one of a plurality of encapsulation layers, the plurality of encapsulation layers including a first encapsulation layer including a plurality of gaps, and a second encapsulation layer disposed between the first encapsulation layer and the plurality of planar emission structures, the second encapsulation layer being in contact with the plurality of planar emission structures. The second encapsulation layer does not include gaps between adjacent planar emission structures of the plurality of planar emission structures. A respective one of the plurality of discontinuities is disposed between each respective pair of adjacent planar emission structures of the plurality of planar emission structures. Multiple pairs of adjacent planar emission structures of the plurality of planar emission structures do not have one of the plurality of discontinuities disposed therebetween. The optical component layer is configured to effectuate an optical function upon ambient light directed toward the plurality of planar emission structures. The optical component layer is configured to act as a quarter-wave retarder. The display further includes a further optical component layer extending across the plurality of planar emission structures. The optical component layer is positioned relative to the plurality of planar emission structures such that the light emitted by the plurality of planar emission structures passes through the encapsulation layer before encountering the further optical component layer. The further optical component layer is not patterned to be discontinuous between each respective pair of adjacent planar emission structures of the plurality of planar emission structures. Each planar emission structure of the plurality of planar emission devices includes a respective organic light emitting diode (OLED) structure configured to provide light for a sub-pixel of the display. Each planar emission structure of the plurality of planar emission devices comprises a respective organic light emitting diode (OLED) pixel of the display. Each discontinuity of the plurality of discontinuities is filled with a material more elastic than the optical component layer. Each discontinuity of the plurality of discontinuities is elongated and oriented along a respective line about which the substrate is bendable. The at least one encapsulation layer includes a continuous encapsulation layer of the plurality of encapsulation layers, and the continuous encapsulation layer is in contact with the plurality of OLED structures. Each discontinuity of the plurality of discontinuities is configured as a respective gap in the optical component layer or the respective encapsulation layer. Multiple pairs of adjacent planar emission structures of the plurality of planar emission structures do not have one of the plurality of discontinuities disposed therebetween. The plurality of encapsulation layers include a first encapsulation layer including a plurality of gaps, each gap of the plurality of gaps laterally positioned between a respective pair of adjacent OLED structures of the plurality of OLED structures, and a second encapsulation layer disposed between the first encapsulation layer and the plurality of OLED structures, the second encapsulation layer being in contact with the plurality of OLED structures. The second encapsulation layer does not include gaps between adjacent OLED structures of the plurality of OLED structures. The plurality of encapsulation layers include a first encapsulation layer including a plurality of notches, each notch of the plurality of notches laterally positioned between a respective pair of adjacent OLED structures of the plurality of OLED structures, and a second encapsulation layer disposed between the first encapsulation layer and the plurality of OLED structures, the second encapsulation layer being in contact with the plurality of OLED structures. The second encapsulation layer is not discontinuous between adjacent OLED structures of the plurality of OLED structures.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A display comprising:
    a substrate;
    a plurality of planar emission structures supported by the substrate;
    an encapsulation layer extending across the plurality of planar emission structures; and
    an optical component layer supported by the substrate, the optical component layer extending across the plurality of planar emission structures, the optical component layer being positioned relative to the plurality of planar emission structures such that light emitted by the plurality of planar emission structures encounters the optical component layer;
    wherein the encapsulation layer is positioned between the plurality of planar emission structures and the optical component layer;
    wherein the optical component layer comprises a plurality of discontinuities, each discontinuity of the plurality of discontinuities laterally positioned between a respective pair of adjacent planar emission structures of the plurality of planar emission structures; and
    wherein each discontinuity of the plurality of discontinuities does not laterally overlap a respective planar emission structure of the plurality of planar emission structures.

2. The display of claim 1, wherein each discontinuity of the plurality of discontinuities is configured as a respective gap in the optical component layer.

3. The display of claim 1, wherein each discontinuity of the plurality of discontinuities is configured as a respective notch in the optical component layer.

4. The display of claim 1, wherein the encapsulation layer is one of a plurality of encapsulation layers, the plurality of encapsulation layers comprising:
    a first encapsulation layer comprising a plurality of gaps; and
    a second encapsulation layer disposed between the first encapsulation layer and the plurality of planar emission structures, the second encapsulation layer being in contact with the plurality of planar emission structures;
    wherein the second encapsulation layer does not include gaps between adjacent planar emission structures of the plurality of planar emission structures.

5. The display of claim 1, wherein a respective one of the plurality of discontinuities is disposed between each respective pair of adjacent planar emission structures of the plurality of planar emission structures.

6. The display of claim 1, wherein multiple pairs of adjacent planar emission structures of the plurality of planar emission structures do not have one of the plurality of discontinuities disposed therebetween.

7. The display of claim 1, wherein the optical component layer is configured to effectuate an optical function upon ambient light directed toward the plurality of planar emission structures.

8. The display of claim 1, wherein the optical component layer is configured to act as a quarter-wave retarder.

9. The display of claim 1, further comprising a further optical component layer extending across the plurality of planar emission structures, wherein:
    the optical component layer is positioned relative to the plurality of planar emission structures such that the light emitted by the plurality of planar emission structures passes through the encapsulation layer before encountering the further optical component layer; and
    the further optical component layer is not patterned to be discontinuous between each respective pair of adjacent planar emission structures of the plurality of planar emission structures.

10. The display of claim 1, wherein each planar emission structure of the plurality of planar emission devices comprises a respective organic light emitting diode (OLED) structure configured to provide light for a sub-pixel of the display.

11. The display of claim 1, wherein each planar emission structure of the plurality of planar emission devices comprises a respective organic light emitting diode (OLED) pixel of the display.

12. The display of claim 1, wherein each discontinuity of the plurality of discontinuities is filled with a material more elastic than the optical component layer.

13. The display of claim 1, wherein each discontinuity of the plurality of discontinuities is elongated and oriented along a respective line about which the substrate is bendable.

14. A display comprising:
- a substrate;
- a plurality of planar emission structures supported by the substrate;
- an encapsulation layer extending across the plurality of planar emission structures; and
- an optical component layer supported by the substrate, the optical component layer extending across the plurality of planar emission structures, the optical component layer being positioned relative to the plurality of planar emission structures such that light emitted by the plurality of planar emission structures encounters the optical component layer;
- wherein the optical component layer comprises a plurality of discontinuities, each discontinuity of the plurality of discontinuities laterally positioned between a respective pair of adjacent planar emission structures of the plurality of planar emission structures;
- wherein the encapsulation layer is one of a plurality of encapsulation layers disposed between the optical component layer and the plurality of planar emission structures, the plurality of encapsulation layers comprising:
  - a first encapsulation layer comprising a plurality of gaps; and
  - a second encapsulation layer disposed between the first encapsulation layer and the plurality of planar emission structures, the second encapsulation layer being in contact with the plurality of planar emission structures; and
- wherein the second encapsulation layer does not include gaps between adjacent planar emission structures of the plurality of planar emission structures.

15. A display comprising:
- a substrate;
- a plurality of planar emission structures supported by the substrate;
- an encapsulation layer extending across the plurality of planar emission structures; and
- an optical component layer supported by the substrate, the optical component layer extending across the plurality of planar emission structures, the optical component layer being positioned relative to the plurality of planar emission structures such that light emitted by the plurality of planar emission structures encounters the optical component layer;
- wherein the optical component layer comprises a plurality of discontinuities, each discontinuity of the plurality of discontinuities laterally positioned between a respective pair of adjacent planar emission structures of the plurality of planar emission structures; and
- wherein each discontinuity of the plurality of discontinuities is filled with a material more elastic than the optical component layer.

16. The display of claim 1, wherein the plurality of discontinuities are filled with a material having a refractive index matched to a refractive index of the optical component layer.

17. The display of claim 1, wherein the plurality of discontinuities are filled with an optically clear adhesive material.

18. The display of claim 1, wherein:
- the optical component layer is a first optical component layer of a plurality of optical component layers that extend across the plurality of planar emission structures;
- the first optical component layer is configured as a quarter-wave retarder;
- the plurality of optical component layers comprises a second optical component layer adjacent the quarter-wave plate and configured to act as a linear polarizer; and
- the plurality of discontinuities extend through the second optical component layer.

19. The display of claim 1, wherein:
- the optical component layer is a first optical component layer of a plurality of optical component layers that extend across the plurality of planar emission structures;
- the plurality of optical component layers are configured to collectively act as a circular polarizer; and
- the plurality of discontinuities extend through the plurality of optical component layers.

20. The display of claim 14, wherein:
- the plurality of encapsulation layers comprises multiple dyads of encapsulation layers disposed above the second encapsulation layer;
- each dyad comprises a respective inorganic layer and a respective organic layer; and
- the plurality of gaps extend through the multiple dyads.

* * * * *